US011283337B2

(12) United States Patent
Lindemann et al.

(10) Patent No.: US 11,283,337 B2
(45) Date of Patent: Mar. 22, 2022

(54) METHODS AND SYSTEMS FOR IMPROVING TRANSDUCER DYNAMICS

(71) Applicant: Cirrus Logic International Semiconductor Ltd., Edinburgh (GB)

(72) Inventors: Eric Lindemann, Boulder, CO (US); Carl Lennart Ståhl, Malmö (SE); Emmanuel Marchais, Dripping Springs, TX (US); John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 75 days.

(21) Appl. No.: 16/816,790

(22) Filed: Mar. 12, 2020

(65) Prior Publication Data

US 2020/0306796 A1 Oct. 1, 2020

Related U.S. Application Data

(60) Provisional application No. 62/826,388, filed on Mar. 29, 2019, provisional application No. 62/826,348, filed on Mar. 29, 2019.

(51) Int. Cl.
*H02K 33/00* (2006.01)
*G06F 3/01* (2006.01)
(Continued)

(52) U.S. Cl.
CPC .......... *H02K 33/00* (2013.01); *B06B 1/0215* (2013.01); *B06B 1/0261* (2013.01); *B06B 1/045* (2013.01);
(Continued)

(58) Field of Classification Search
None
See application file for complete search history.

(56) References Cited

U.S. PATENT DOCUMENTS 3,686,927 A 8/1972 Scharton
4,902,136 A 2/1990 Mueller et al.
(Continued)

FOREIGN PATENT DOCUMENTS

AU 2002347829 4/2003
CN 103165328 A 6/2013
(Continued)

OTHER PUBLICATIONS

International Search Report and Written Opinion of the International Searching Authority, International Application No. PCT/GB2019/052991, dated Mar. 17, 2020.
(Continued)

*Primary Examiner* — Thomas J. Hiltunen
*Assistant Examiner* — Khareem E Almo
(74) *Attorney, Agent, or Firm* — Jackson Walker L.L.P.

(57) ABSTRACT

A system may include a signal generator configured to generate a raw waveform signal and a modeling subsystem configured to implement a discrete time model of an electromagnetic load that emulates a virtual electromagnetic load and further configured to modify the raw waveform signal to generate a waveform signal for driving the electromagnetic load by modifying the virtual electromagnetic load to have a desired characteristic, applying the discrete time model to the raw waveform signal to generate the waveform signal for driving the electromagnetic load, and applying the waveform signal to the electromagnetic load.

21 Claims, 6 Drawing Sheets

(51) Int. Cl.
  *H03F 1/02* (2006.01)
  *B06B 1/02* (2006.01)
  *B06B 1/04* (2006.01)
  *G06F 1/02* (2006.01)
  *G08B 6/00* (2006.01)

(52) U.S. Cl.
  CPC .............. *G06F 1/022* (2013.01); *G06F 3/016* (2013.01); *G08B 6/00* (2013.01); *H03F 1/0211* (2013.01)

(56) References Cited

U.S. PATENT DOCUMENTS

| | | |
|---|---|---|
| 5,684,722 A | 11/1997 | Thorner et al. |
| 5,748,578 A | 5/1998 | Schell |
| 5,857,986 A | 1/1999 | Moriyasu |
| 6,050,393 A | 4/2000 | Murai et al. |
| 6,278,790 B1 | 8/2001 | Davis et al. |
| 6,332,029 B1 | 12/2001 | Azima et al. |
| 6,388,520 B2 | 5/2002 | Wada et al. |
| 6,567,478 B2 | 5/2003 | Oishi et al. |
| 6,580,796 B1 | 6/2003 | Kuroki |
| 6,659,208 B2 | 12/2003 | Gaffney et al. |
| 6,683,437 B2 | 1/2004 | Tierling |
| 6,703,550 B2 | 3/2004 | Chu |
| 6,762,745 B1 | 7/2004 | Braun et al. |
| 6,768,779 B1 | 7/2004 | Nielsen |
| 6,784,740 B1 | 8/2004 | Tabatabaei |
| 6,906,697 B2 | 6/2005 | Rosenberg |
| 6,995,747 B2 | 2/2006 | Casebolt et al. |
| 7,154,470 B2 | 12/2006 | Tierling |
| 7,277,678 B2 | 10/2007 | Rozenblit et al. |
| 7,333,604 B2 | 2/2008 | Zernovizky et al. |
| 7,392,066 B2 | 6/2008 | Hapamas |
| 7,456,688 B2 | 11/2008 | Okazaki et al. |
| 7,623,114 B2 | 11/2009 | Rank |
| 7,639,232 B2 | 12/2009 | Grant et al. |
| 7,791,588 B2 | 9/2010 | Tierling et al. |
| 7,979,146 B2 | 7/2011 | Ullrich et al. |
| 8,068,025 B2 | 11/2011 | Devenyi et al. |
| 8,098,234 B2 | 1/2012 | Lacroix et al. |
| 8,102,364 B2 | 1/2012 | Tierling |
| 8,325,144 B1 | 12/2012 | Tierling et al. |
| 8,427,286 B2 | 4/2013 | Grant et al. |
| 8,441,444 B2 | 5/2013 | Moore et al. |
| 8,466,778 B2 | 6/2013 | Hwang et al. |
| 8,480,240 B2 | 7/2013 | Kashiyama |
| 8,572,293 B2 | 10/2013 | Cruz-Hernandez et al. |
| 8,572,296 B2 | 10/2013 | Shasha et al. |
| 8,593,269 B2 | 11/2013 | Grant et al. |
| 8,648,829 B2 | 2/2014 | Shahoian et al. |
| 8,754,757 B1 | 6/2014 | Ullrich et al. |
| 8,947,216 B2 | 2/2015 | Da Costa et al. |
| 8,981,915 B2 | 3/2015 | Birnbaum et al. |
| 8,994,518 B2 | 3/2015 | Gregorio et al. |
| 9,030,428 B2 | 5/2015 | Fleming |
| 9,063,570 B2 | 6/2015 | Weddle et al. |
| 9,083,821 B2 | 7/2015 | Hughes |
| 9,092,059 B2 | 7/2015 | Bhatia |
| 9,117,347 B2 | 8/2015 | Matthews |
| 9,128,523 B2 | 9/2015 | Buuck et al. |
| 9,164,587 B2 | 10/2015 | Da Costa et al. |
| 9,196,135 B2 | 11/2015 | Shah et al. |
| 9,248,840 B2 | 2/2016 | Truong |
| 9,326,066 B2 | 4/2016 | Klippel |
| 9,329,721 B1 | 5/2016 | Buuck et al. |
| 9,354,704 B2 | 5/2016 | Lacroix et al. |
| 9,368,005 B2 | 6/2016 | Cruz-Hernandez et al. |
| 9,489,047 B2 | 11/2016 | Jiang et al. |
| 9,495,013 B2 | 11/2016 | Underkoffler et al. |
| 9,507,423 B2 | 11/2016 | Gandhi et al. |
| 9,513,709 B2 | 12/2016 | Gregorio et al. |
| 9,520,036 B1 | 12/2016 | Buuck |
| 9,588,586 B2 | 3/2017 | Rihn |
| 9,640,047 B2 | 5/2017 | Choi et al. |
| 9,652,041 B2 | 5/2017 | Jiang et al. |
| 9,696,859 B1 | 7/2017 | Heller et al. |
| 9,697,450 B1 | 7/2017 | Lee |
| 9,715,300 B2 | 7/2017 | Sinclair et al. |
| 9,740,381 B1 | 8/2017 | Chaudhri et al. |
| 9,842,476 B2 | 12/2017 | Rihn et al. |
| 9,864,567 B2 | 1/2018 | Seo |
| 9,881,467 B2 | 1/2018 | Levesque |
| 9,886,829 B2 | 2/2018 | Levesque |
| 9,946,348 B2 | 4/2018 | Ullrich et al. |
| 9,947,186 B2 | 4/2018 | Macours |
| 9,959,744 B2 | 5/2018 | Koskan et al. |
| 9,965,092 B2 | 5/2018 | Smith |
| 10,032,550 B1 | 7/2018 | Zhang et al. |
| 10,055,950 B2 | 8/2018 | Saboune et al. |
| 10,074,246 B2 | 9/2018 | Da Costa et al. |
| 10,110,152 B1 | 10/2018 | Hajati |
| 10,171,008 B2 | 1/2019 | Nishitani et al. |
| 10,175,763 B2 | 1/2019 | Shah |
| 10,264,348 B1 | 4/2019 | Harris et al. |
| 10,447,217 B2 | 10/2019 | Zhao et al. |
| 10,564,727 B2 | 2/2020 | Billington et al. |
| 10,620,704 B2 | 4/2020 | Rand et al. |
| 10,667,051 B2 | 5/2020 | Stahl |
| 10,726,638 B2 | 7/2020 | Mondello et al. |
| 10,726,683 B1 * | 7/2020 | Marchais .................. B06B 1/04 |
| 10,732,714 B2 | 8/2020 | Rao et al. |
| 10,782,785 B2 | 9/2020 | Hu et al. |
| 10,795,443 B2 | 10/2020 | Hu et al. |
| 10,820,100 B2 | 10/2020 | Stahl et al. |
| 10,828,672 B2 | 11/2020 | Stahl et al. |
| 10,832,537 B2 | 11/2020 | Doy et al. |
| 10,848,886 B2 | 11/2020 | Rand |
| 10,860,202 B2 | 12/2020 | Sepehr et al. |
| 10,969,871 B2 | 4/2021 | Rand et al. |
| 11,069,206 B2 | 7/2021 | Rao et al. |
| 11,139,767 B2 | 10/2021 | Janko et al. |
| 11,150,733 B2 | 10/2021 | Das et al. |
| 2001/0043714 A1 | 11/2001 | Asada et al. |
| 2002/0018578 A1 | 2/2002 | Burton |
| 2002/0085647 A1 | 7/2002 | Oishi et al. |
| 2003/0068053 A1 | 4/2003 | Chu |
| 2003/0214485 A1 | 11/2003 | Roberts |
| 2005/0031140 A1 | 2/2005 | Browning |
| 2005/0134562 A1 | 6/2005 | Grant et al. |
| 2006/0028095 A1 | 2/2006 | Maruyama et al. |
| 2006/0197753 A1 | 9/2006 | Hotelling |
| 2006/0284856 A1 | 12/2006 | Soss |
| 2007/0241816 A1 | 10/2007 | Okazaki et al. |
| 2008/0077367 A1 * | 3/2008 | Odajima .................. G06F 30/23 |
| | | 703/2 |
| 2008/0226109 A1 | 9/2008 | Yamakata et al. |
| 2008/0240458 A1 | 10/2008 | Goldstein et al. |
| 2008/0293453 A1 | 11/2008 | Atlas et al. |
| 2008/0316181 A1 | 12/2008 | Nurmi |
| 2009/0020343 A1 | 1/2009 | Rothkopf et al. |
| 2009/0079690 A1 | 3/2009 | Watson et al. |
| 2009/0088220 A1 | 4/2009 | Persson |
| 2009/0096632 A1 | 4/2009 | Ullrich et al. |
| 2009/0102805 A1 | 4/2009 | Meijer et al. |
| 2009/0128306 A1 | 5/2009 | Luden et al. |
| 2009/0153499 A1 | 6/2009 | Kim et al. |
| 2009/0278819 A1 | 11/2009 | Goldenberg et al. |
| 2010/0013761 A1 | 1/2010 | Birnbaum et al. |
| 2010/0085317 A1 | 4/2010 | Park et al. |
| 2010/0141408 A1 | 6/2010 | Doy et al. |
| 2010/0260371 A1 | 10/2010 | Afshar |
| 2010/0261526 A1 | 10/2010 | Anderson et al. |
| 2011/0056763 A1 | 3/2011 | Tanase et al. |
| 2011/0075835 A1 | 3/2011 | Hill |
| 2011/0141052 A1 | 6/2011 | Bernstein et al. |
| 2011/0161537 A1 * | 6/2011 | Chang ..................... H04L 27/00 |
| | | 710/107 |
| 2011/0163985 A1 | 7/2011 | Bae et al. |
| 2011/0167391 A1 | 7/2011 | Momeyer et al. |
| 2012/0011436 A1 | 1/2012 | Jinkinson et al. |
| 2012/0105358 A1 | 5/2012 | Momeyer et al. |
| 2012/0112894 A1 | 5/2012 | Yang et al. |
| 2012/0206246 A1 | 8/2012 | Cruz-Hernandez et al. |

(56) References Cited

U.S. PATENT DOCUMENTS

| | | |
|---|---|---|
| 2012/0206247 A1 | 8/2012 | Bhatia et al. |
| 2012/0229264 A1 | 9/2012 | Company Bosch et al. |
| 2012/0253698 A1 | 10/2012 | Cokonaj |
| 2012/0306631 A1 | 12/2012 | Hughes |
| 2013/0016855 A1 | 1/2013 | Lee et al. |
| 2013/0027359 A1 | 1/2013 | Schevin et al. |
| 2013/0038792 A1 | 2/2013 | Quigley et al. |
| 2013/0096849 A1 | 4/2013 | Campbell et al. |
| 2013/0141382 A1 | 6/2013 | Simmons et al. |
| 2013/0275058 A1 | 10/2013 | Awad |
| 2013/0289994 A1 | 10/2013 | Newman et al. |
| 2014/0056461 A1 | 2/2014 | Afshar |
| 2014/0064516 A1 | 3/2014 | Cruz-Hernandez et al. |
| 2014/0079248 A1 | 3/2014 | Short et al. |
| 2014/0118125 A1 | 5/2014 | Bhatia |
| 2014/0118126 A1 | 5/2014 | Garg et al. |
| 2014/0119244 A1 | 5/2014 | Steer et al. |
| 2014/0139327 A1 | 5/2014 | Bau et al. |
| 2014/0226068 A1 | 8/2014 | Lacroix et al. |
| 2014/0292501 A1 | 10/2014 | Lim et al. |
| 2014/0340209 A1 | 11/2014 | Lacroix et al. |
| 2014/0347176 A1 | 11/2014 | Modarres et al. |
| 2015/0061846 A1 | 3/2015 | Yliaho |
| 2015/0070149 A1 | 3/2015 | Cruz-Hernandez et al. |
| 2015/0070151 A1 | 3/2015 | Cruz-Hernandez et al. |
| 2015/0070260 A1 | 3/2015 | Saboune et al. |
| 2015/0084752 A1 | 3/2015 | Heubel et al. |
| 2015/0130767 A1 | 5/2015 | Myers et al. |
| 2015/0208189 A1 | 7/2015 | Tsai |
| 2015/0216762 A1 | 8/2015 | Oohashi et al. |
| 2015/0234464 A1 | 8/2015 | Yliaho |
| 2015/0324116 A1 | 11/2015 | Marsden et al. |
| 2015/0325116 A1 | 11/2015 | Umminger, III |
| 2015/0341714 A1 | 11/2015 | Ahn et al. |
| 2016/0004311 A1 | 1/2016 | Yliaho |
| 2016/0007095 A1 | 1/2016 | Lacroix |
| 2016/0063826 A1 | 3/2016 | Morrell et al. |
| 2016/0070392 A1 | 3/2016 | Wang et al. |
| 2016/0074278 A1 | 3/2016 | Muench et al. |
| 2016/0132118 A1 | 5/2016 | Park et al. |
| 2016/0141606 A1 | 5/2016 | Ahn et al. |
| 2016/0162031 A1 | 6/2016 | Westerman et al. |
| 2016/0179203 A1 | 6/2016 | Modarres et al. |
| 2016/0239089 A1 | 8/2016 | Taninaka et al. |
| 2016/0246378 A1 | 8/2016 | Sampanes et al. |
| 2016/0291731 A1 | 10/2016 | Liu et al. |
| 2016/0358605 A1 | 12/2016 | Ganong, III et al. |
| 2017/0052593 A1 | 2/2017 | Jiang et al. |
| 2017/0078804 A1 | 3/2017 | Guo et al. |
| 2017/0083096 A1 | 3/2017 | Rihn et al. |
| 2017/0090572 A1 | 3/2017 | Holenarsipur et al. |
| 2017/0090573 A1 | 3/2017 | Hajati et al. |
| 2017/0153760 A1 | 6/2017 | Chawda et al. |
| 2017/0168574 A1 | 6/2017 | Zhang |
| 2017/0169674 A1 | 6/2017 | Macours |
| 2017/0220197 A1 | 8/2017 | Matsumoto et al. |
| 2017/0277350 A1 | 9/2017 | Wang et al. |
| 2017/0357440 A1 | 12/2017 | Tse |
| 2018/0059733 A1 | 3/2018 | Gault et al. |
| 2018/0059793 A1 | 3/2018 | Hajati |
| 2018/0067557 A1 | 3/2018 | Robert et al. |
| 2018/0074637 A1 | 3/2018 | Rosenberg et al. |
| 2018/0082673 A1 | 3/2018 | Tzanetos |
| 2018/0084362 A1 | 3/2018 | Zhang et al. |
| 2018/0151036 A1 | 5/2018 | Cha et al. |
| 2018/0158289 A1 | 6/2018 | Vasilev et al. |
| 2018/0159452 A1 | 6/2018 | Eke et al. |
| 2018/0159457 A1 | 6/2018 | Eke |
| 2018/0159545 A1 | 6/2018 | Eke et al. |
| 2018/0160227 A1 | 6/2018 | Lawrence et al. |
| 2018/0165925 A1 | 6/2018 | Israr et al. |
| 2018/0178114 A1 | 6/2018 | Mizuta et al. |
| 2018/0182212 A1 | 6/2018 | Li et al. |
| 2018/0183372 A1 | 6/2018 | Li et al. |
| 2018/0196567 A1 | 7/2018 | Klein et al. |
| 2018/0237033 A1 | 8/2018 | Hakeem et al. |
| 2018/0253123 A1 | 9/2018 | Levesque et al. |
| 2018/0255411 A1 | 9/2018 | Lin et al. |
| 2018/0267897 A1 | 9/2018 | Jeong |
| 2018/0321748 A1 | 11/2018 | Rao et al. |
| 2018/0329172 A1 | 11/2018 | Tabuchi |
| 2018/0335848 A1 | 11/2018 | Moussette et al. |
| 2018/0367897 A1 | 12/2018 | Bjork et al. |
| 2019/0020760 A1 | 1/2019 | DeBates et al. |
| 2019/0227628 A1 | 1/2019 | Rand et al. |
| 2019/0064925 A1 | 2/2019 | Kim et al. |
| 2019/0069088 A1 | 2/2019 | Seiler |
| 2019/0073078 A1 | 3/2019 | Sheng et al. |
| 2019/0103829 A1 | 4/2019 | Vasudevan et al. |
| 2019/0138098 A1 | 5/2019 | Shah |
| 2019/0163234 A1 | 5/2019 | Kim et al. |
| 2019/0196596 A1 | 6/2019 | Yokoyama et al. |
| 2019/0206396 A1 | 7/2019 | Chen |
| 2019/0215349 A1 | 7/2019 | Adams et al. |
| 2019/0220095 A1 | 7/2019 | Ogita et al. |
| 2019/0228619 A1 | 7/2019 | Yokoyama et al. |
| 2019/0114496 A1 | 8/2019 | Lesso |
| 2019/0235629 A1 | 8/2019 | Hu et al. |
| 2019/0294247 A1 | 9/2019 | Hu et al. |
| 2019/0296674 A1 | 9/2019 | Janko et al. |
| 2019/0297418 A1 | 9/2019 | Stahl |
| 2019/0311590 A1 | 10/2019 | Doy et al. |
| 2019/0341903 A1 | 11/2019 | Kim |
| 2020/0117506 A1 | 4/2020 | Chan |
| 2020/0218352 A1 | 7/2020 | Macours et al. |
| 2020/0313529 A1* | 10/2020 | Lindemann ............ H03F 1/0211 |
| 2020/0313654 A1 | 10/2020 | Marchais et al. |
| 2020/0314969 A1* | 10/2020 | Marchais ................ H02M 7/48 |
| 2020/0401292 A1 | 12/2020 | Lorenz et al. |
| 2020/0403546 A1* | 12/2020 | Janko .................... H02P 25/034 |
| 2021/0108975 A1 | 4/2021 | Peso Parada et al. |
| 2021/0125469 A1* | 4/2021 | Alderson ................. G08B 6/00 |
| 2021/0157436 A1 | 5/2021 | Peso Parada et al. |
| 2021/0174777 A1* | 6/2021 | Marchais ............... G01R 27/02 |
| 2021/0175869 A1 | 6/2021 | Taipale |
| 2021/0200316 A1 | 7/2021 | Das et al. |
| 2021/0325967 A1 | 10/2021 | Khenkin et al. |
| 2021/0328535 A1 | 10/2021 | Khenkin et al. |
| 2021/0365118 A1 | 11/2021 | Rajapurkar et al. |

FOREIGN PATENT DOCUMENTS

| | | |
|---|---|---|
| CN | 103403796 A | 11/2013 |
| CN | 204903757 U | 12/2015 |
| CN | 105264551 A | 1/2016 |
| CN | 106438890 A | 2/2017 |
| CN | 106950832 A | 7/2017 |
| CN | 107665051 A | 2/2018 |
| EP | 0784844 B1 | 6/2005 |
| EP | 2363785 A1 | 9/2011 |
| EP | 2487780 A1 | 8/2012 |
| EP | 2600225 A1 | 6/2013 |
| EP | 2846218 A1 | 3/2015 |
| EP | 2846229 A2 | 3/2015 |
| EP | 2846329 A1 | 3/2015 |
| EP | 2988528 A1 | 2/2016 |
| EP | 3125508 A1 | 2/2017 |
| EP | 3379382 A1 | 9/2018 |
| GB | 201620746 A | 1/2017 |
| IN | 201747044027 | 8/2018 |
| JP | H02130433 B2 | 5/1990 |
| JP | 08149006 A | 6/1996 |
| JP | 6026751 B2 | 11/2016 |
| JP | 6250985 | 12/2017 |
| JP | 6321351 | 5/2018 |
| KR | 20120126446 A | 11/2012 |
| WO | 2013104919 A1 | 7/2013 |
| WO | 2013186845 A1 | 12/2013 |
| WO | 2014018086 A1 | 1/2014 |
| WO | 2014094283 A1 | 6/2014 |
| WO | 2016105496 A1 | 6/2016 |
| WO | 2016164193 A1 | 10/2016 |
| WO | 2017113651 A1 | 7/2017 |
| WO | 2018053159 A1 | 3/2018 |

(56) References Cited

FOREIGN PATENT DOCUMENTS

| WO | 2018067613 A1 | 4/2018 |
|---|---|---|
| WO | 2018125347 A1 | 7/2018 |
| WO | 2020004840 A1 | 1/2020 |
| WO | 2020055405 A1 | 3/2020 |

OTHER PUBLICATIONS

International Search Report and Written Opinion of the International Searching Authority, International Application No. PCT/US2020/023342, dated Jun. 9, 2020.
International Search Report and Written Opinion of the International Searching Authority, International Application No. PCT/GB2020/050823, dated Jun. 30, 2020.
Communication Relating to the Results of the Partial International Search, and Provisional Opinion Accompanying the Partial Search Result, of the International Searching Authority, International Application No. PCT/GB2020/050822, dated Jul. 9, 2020.
International Search Report and Written Opinion of the International Searching Authority, International Application No. PCT/GB2020/051037, dated Jul. 9, 2020.
International Search Report and Written Opinion of the International Searching Authority, International Application No. PCT/GB2020/051035, dated Jul. 10, 2020.
First Examination Opinion Notice, State Intellectual Property Office of the People's Republic of China, Application No. 201880037435.X, dated Dec. 31, 2020.
International Search Report and Written Opinion of the International Searching Authority, International Application No. PCT/GB2019/050964, dated Sep. 3, 2019.
International Search Report and Written Opinion of the International Searching Authority, International Application No. PCT/GB2019/050770, dated Jul. 5, 2019.
Communication Relating to the Results of the Partial International Search, and Provisional Opinion Accompanying the Partial Search Result, of the International Searching Authority, International Application No. PCT/US2018/031329, dated Jul. 20, 2018.
Combined Search and Examination Report, UKIPO, Application No. GB1720424.9, dated Jun. 5, 2018.
International Search Report and Written Opinion of the International Searching Authority, International Application No. PCT/US2020/024864, dated Jul. 6, 2020.
International Search Report and Written Opinion of the International Searching Authority, International Application No. PCT/GB2020/050822, dated Aug. 31, 2020.
International Search Report and Written Opinion of the International Searching Authority, International Application No. PCT/GB2020/051438, dated Sep. 28, 2020.
Invitation to Pay Additional Fees, Partial International Search Report and Provisional Opinion of the International Searching Authority, International Application No. PCT/US2020/052537, dated Jan. 14, 2021.
International Search Report and Written Opinion of the International Searching Authority, International Application No. PCT/US2020/056610, dated Jan. 21, 2021.
International Search Report and Written Opinion of the International Searching Authority, International Application No. PCT/GB2020/052537, dated Mar. 9, 2021.
Office Action of the Intellectual Property Office, ROC (Taiwan) Patent Application No. 107115475, dated Apr. 30, 2021.
First Office Action, China National Intellectual Property Administration, Patent Application No. 2019800208570, dated Jun. 3, 2021.
International Search Report and Written Opinion of the International Searching Authority, International Application No. PCT/US2021/021908, dated Jun. 9, 2021.
Notice of Preliminary Rejection, Korean Intellectual Property Office, Application No. 10-2019-7036236, dated Jun. 29, 2021.
Combined Search and Examination Report, United Kingdom Intellectual Property Office, Application No. GB2018051.9, dated Jun. 30, 2021.
Communication pursuant to Rule 164(2)(b) and Article 94(3) EPC, European Patent Office, Application No. 18727512.8, dated Jul. 8, 2021.
Gottfried Behler: "Measuring the Loudspeaker's Impedance during Operation for the Derivation of the Voice Coil Temperature", AES Convention Preprint, Feb. 25, 1995 (Feb. 25, 1995), Paris.
First Office Action, China National Intellectual Property Administration, Patent Application No. 2019800211287, dated Jul. 5, 2021.
Steinbach et al., Haptic Data Compression and Communication, IEEE Signal Processing Magazine, Jan. 2011.
Pezent et al., Syntacts Open-Source Software and Hardware for Audio-Controlled Haptics, IEEE Transactions on Haptics, vol. 14, No. 1, Jan.-Mar. 2021.
Danieau et al., Enhancing Audiovisual Experience with Haptic Feedback: A Survey on HAV, IEEE Transactions on Haptics, vol. 6, No. 2, Apr.-Jun. 2013.
Danieau et al., Toward Haptic Cinematography: Enhancing Movie Experiences with Camera-Based Haptic Effects, IEEE Computer Society, IEEE MultiMedia, Apr.-Jun. 2014.
Jaijongrak et al., A Haptic and Auditory Assistive User Interface: Helping the Blinds on their Computer Operations, 2011 IEEE International Conference on Rehabilitation Robotics, Rehab Week Zurich, ETH Zurich Science City, Switzerland, Jun. 29-Jul. 1, 2011.
Lim et al., An Audio-Haptic Feedbacks for Enhancing User Experience in Mobile Devices, 2013 IEEE International Conference on Consumer Electronics (ICCE).
Weddle et al., How Does Audio-Haptic Enhancement Influence Emotional Response to Mobile Media, 2013 Fifth International Workshop on Quality of Multimedia Experience (QoMEX), QMEX 2013.
Examination Report under Section 18(3), United Kingdom Intellectual Property Office, Application No. GB2018051.9, dated Nov. 5, 2021.
Final Notice of Preliminary Rejection, Korean Patent Office, Application No. 10-2019-7036236, dated Nov. 29, 2021.
Examination Report under Section 18(3), United Kingdom Intellectual Property Office, Application No. GB2018050.1, dated Dec. 22, 2021.

\* cited by examiner

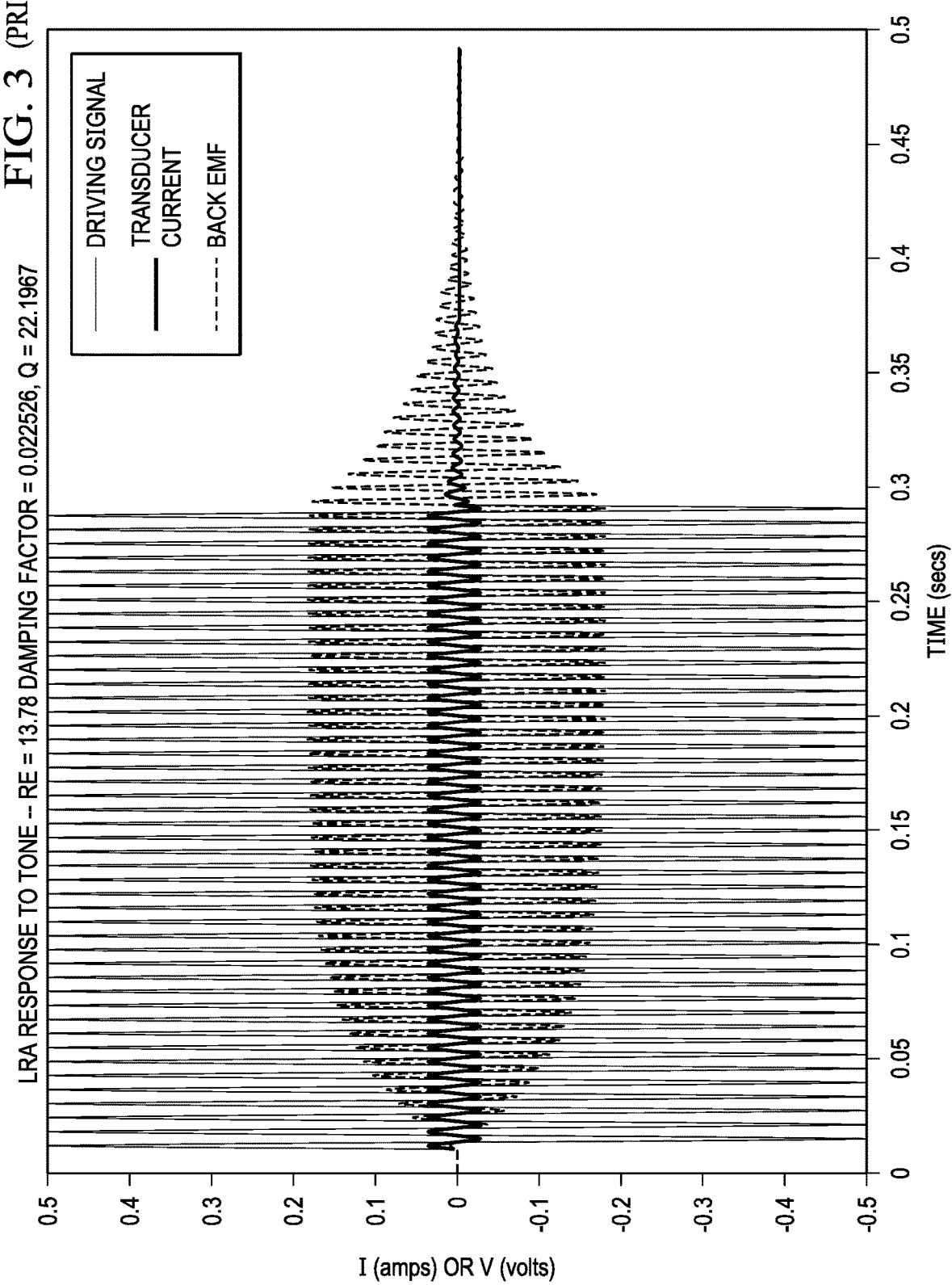

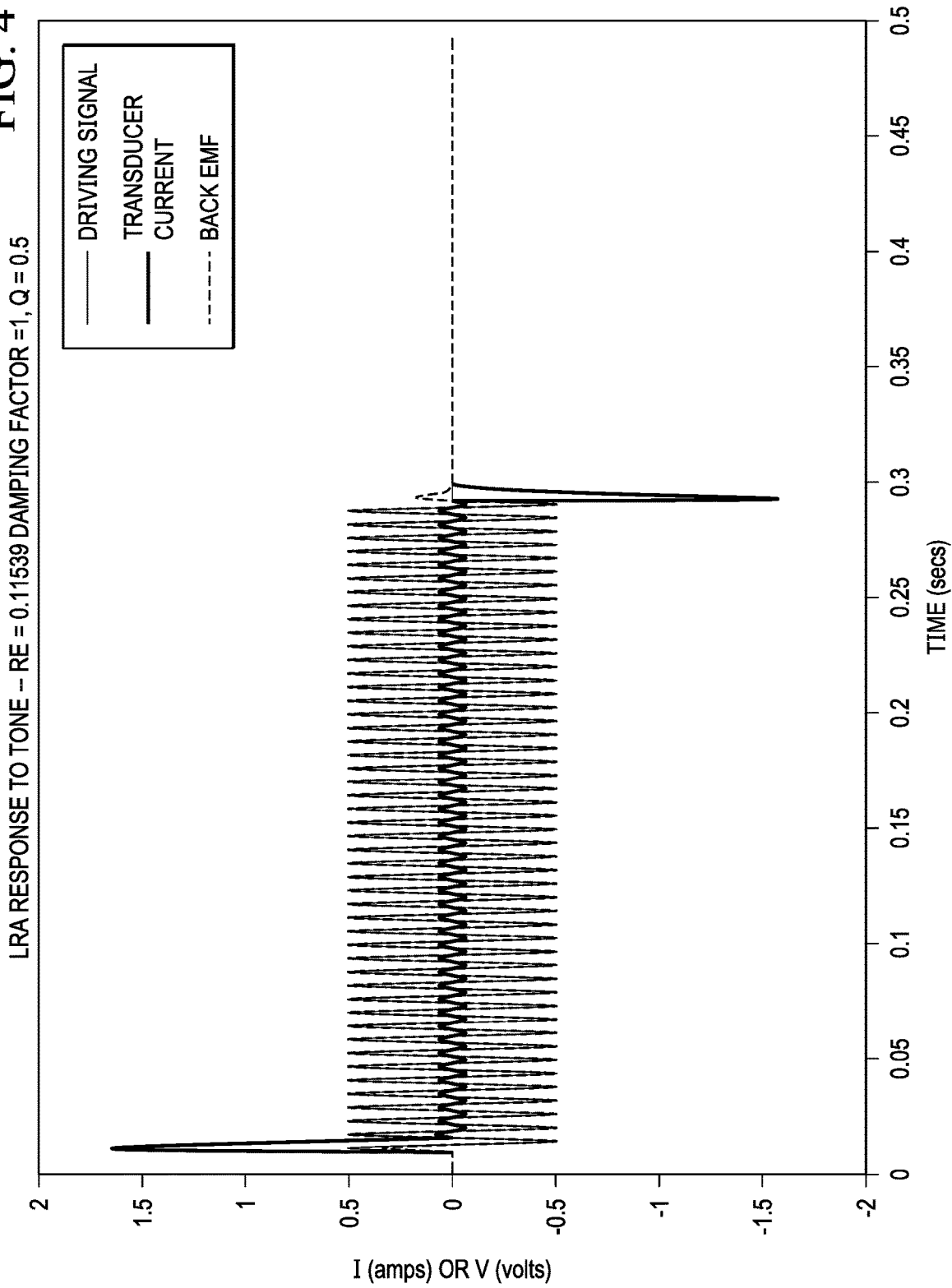

METHODS AND SYSTEMS FOR IMPROVING TRANSDUCER DYNAMICS

RELATED APPLICATION

The present disclosure claims priority to U.S. Provisional Patent Application Ser. No. 62/826,348, filed Mar. 29, 2019, and U.S. Provisional Patent Application Ser. No. 62/826,388, filed Mar. 29, 2019, each of which is incorporated by reference herein in its entirety.

FIELD OF DISCLOSURE

The present disclosure relates in general to improving dynamics of a transducer, for example, a haptic transducer.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin, and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a haptic transducer 103 based on the signal. Controller 101 may be triggered by a trigger to output to the signal. The trigger may for example comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2*\pi*\sqrt{C*M}} \quad (1)$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping of the device, the vibration resonance of the haptic transducer may vary from time to time.

FIG. 2A illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions.

FIG. 2B illustrates an example of an LRA modelled as a linear system, including an electrically equivalent model of mass-spring system 201 of LRA. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

An electromagnetic load such as an LRA may be characterized by its impedance $Z_{LRA}$ as seen as the sum of a coil impedance $Z_{coil}$ and a mechanical impedance $Z_{mech}$:

$$Z_{LRA} = Z_{coil} + Z_{mech} \quad (2)$$

Coil impedance $Z_{coil}$ may in turn comprise a direct current (DC) resistance Re in series with an inductance Le:

$$Z_{coil} = Re + s*Le \quad (3)$$

Mechanical impedance $Z_{mech}$ may be defined by three parameters including the resistance at resonance $R_{RES}$ representing an electrical resistance representative of mechanical friction of the mass-spring system of the haptic transducer, a capacitance $C_{MES}$ representing an electrical capacitance representative of an equivalent moving mass M of the mass-spring system of the haptic transducer, and inductance $L_{CES}$ representative of a compliance C of the mass-spring system of the haptic transducer. The electrical equivalent of the total mechanical impedance is the parallel connection of $R_{RES}$, $C_{MES}$, $L_{CES}$. The Laplace transform of this parallel connection is described by:

$$Z_{mech}(s) = \frac{1}{\left(\frac{1}{R_{RES}} + \frac{1}{L_{CES}*s} + c_{MES}*s\right)} \quad (4)$$

The resonant frequency $f_0$ of the haptic transducer can be represented as:

$$f_0 = \frac{1}{\left(2*\pi*\sqrt{L_{CES}*C_{MES*}}\right)} \quad (5)$$

The quality factor Q of the LRA can be represented as:

$$Q = \frac{R_{RES}*Re}{R_{RES}+Re} * \sqrt{\frac{c_{MES}}{L_{CES}}} \quad (6)$$

Referring to equation (6), it may appear non-intuitive that the expression involves a subexpression describing the parallel connection of resistances Re and $$R_{RES}\left(\text{i.e.,} \frac{R_{RES}*Re}{R_{RES}+Re}\right)$$

while in FIG. 2B these resistances are shown in a series connection. However, such may be the case where a driving voltage Ve is oscillating but then abruptly turns off and goes to zero. The voltage amplifier shown in FIG. 2B may be considered to have a low source impedance, ideally zero source impedance. Under these conditions, when driving voltage Ve goes to zero, the voltage amplifier effectively disappears from the circuit. At that point, the top-most terminal of resistance Re in FIG. 2B is grounded as is the bottom-most terminal of resistance $R_{RES}$ and so resistances Re and $R_{RES}$ are indeed connected in parallel as reflected in equation (6).

Electromagnetic transducers, such as LRAs or microspeakers, may have slow response times. FIG. 3 is a graph of an example response of an LRA, depicting an example driving signal to the LRA, a current through the LRA, and a back electromotive force (back EMF) of the LRA, wherein such back EMF may be proportional to the velocity of a moving element (e.g., coil or magnet) of the transducer. As shown in FIG. 3, the attack time of the back EMF may be slow as energy is transferred to the LRA, and some "ringing" of the back EMF may occur after the driving signal has ended as the mechanical energy stored in the LRA is discharged. In the context of a haptic LRA, such behavioral characteristic may result in a "mushy" feeling click or pulse, instead of a "crisp" tactile response. Thus, it may be desirable for an LRA to instead have a response similar to that shown in FIG. 4, in which there exists minimal ringing after the driving signal has ended, and which may provide a more "crisp" tactile response in a haptic context. Accordingly, it may be desirable to apply processing to a driving signal such that when the processed driving signal is applied to the transducer, the velocity or back EMF of the transducer more closely approaches that of FIG. 4.

SUMMARY

In accordance with the teachings of the present disclosure, the disadvantages and problems associated with undesirable dynamics of an electromagnetic load may be reduced or eliminated.

In accordance with embodiments of the present disclosure, a system may include a signal generator configured to generate a raw waveform signal and a modeling subsystem configured to implement a discrete time model of an electromagnetic load that emulates a virtual electromagnetic load and further configured to modify the raw waveform signal to generate a waveform signal for driving the electromagnetic load by modifying the virtual electromagnetic load to have a desired characteristic, applying the discrete time model to the raw waveform signal to generate the waveform signal for driving the electromagnetic load, and applying the waveform signal to the electromagnetic load.

In accordance with these and other embodiments of the present disclosure, a method may include implementing a discrete time model of an electromagnetic load that emulates a virtual electromagnetic load and modifying a raw waveform signal to generate a waveform signal for driving the electromagnetic load by modifying the virtual electromagnetic load to have a desired characteristic applying the discrete time model to the raw waveform signal to generate the waveform signal for driving the electromagnetic load, and applying the waveform signal to the electromagnetic load.

In accordance with these and other embodiments of the present disclosure, a host device may include an electromagnetic load, a signal generator configured to generate a raw waveform signal, and a modeling subsystem configured to implement a discrete time model of the electromagnetic load that emulates a virtual electromagnetic load and further configured to modify the raw waveform signal to generate a waveform signal for driving the electromagnetic load by modifying the virtual electromagnetic load to have a desired characteristic, applying the discrete time model to the raw waveform signal to generate the waveform signal for driving the electromagnetic load, and applying the waveform signal to the electromagnetic load.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 3 illustrates a graph of example waveforms of an electromagnetic load, as is known in the art;

FIG. 4 illustrates a graph of desirable example waveforms of an electromagnetic load, in accordance with embodiments of the present disclosure;

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal will generally be an analog time varying voltage signal, for example, a time varying waveform.

The problem illustrated in FIG. 3 may result from a transducer 301 with a high quality factor Q with a sharp peak in impedance at a resonant frequency $f_O$ of the transducer.

Figure 1:
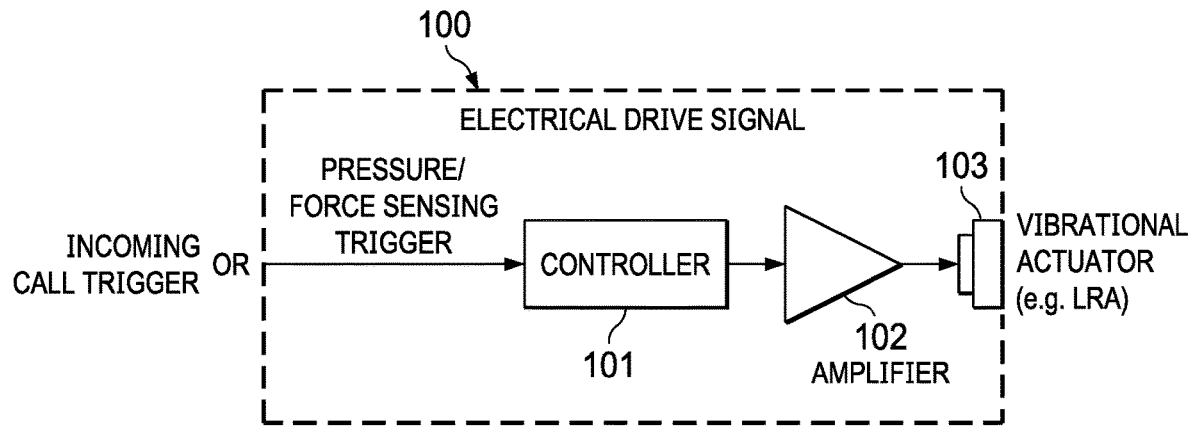
FIG. 1 illustrates an example of a vibro-haptic system in a device, as is known in the art.
Figure 2A:
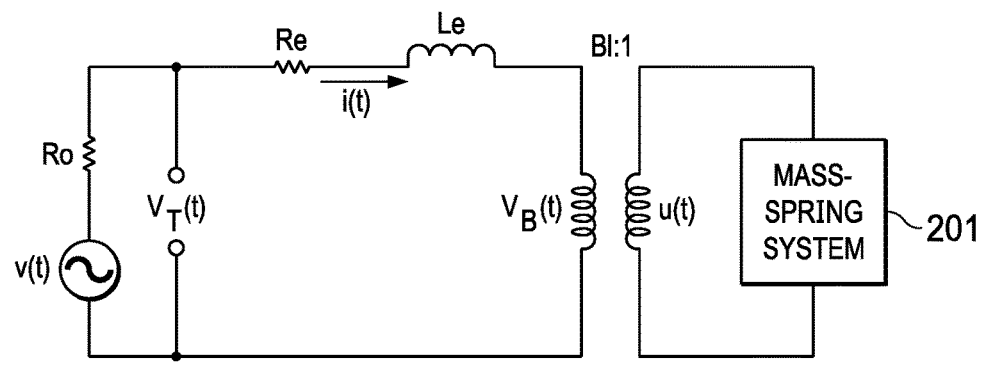
FIGS. 2A and 2B each illustrate an example of a Linear Resonant Actuator (LRA) modelled as a linear system, as is known in the art.
Figure 2B:
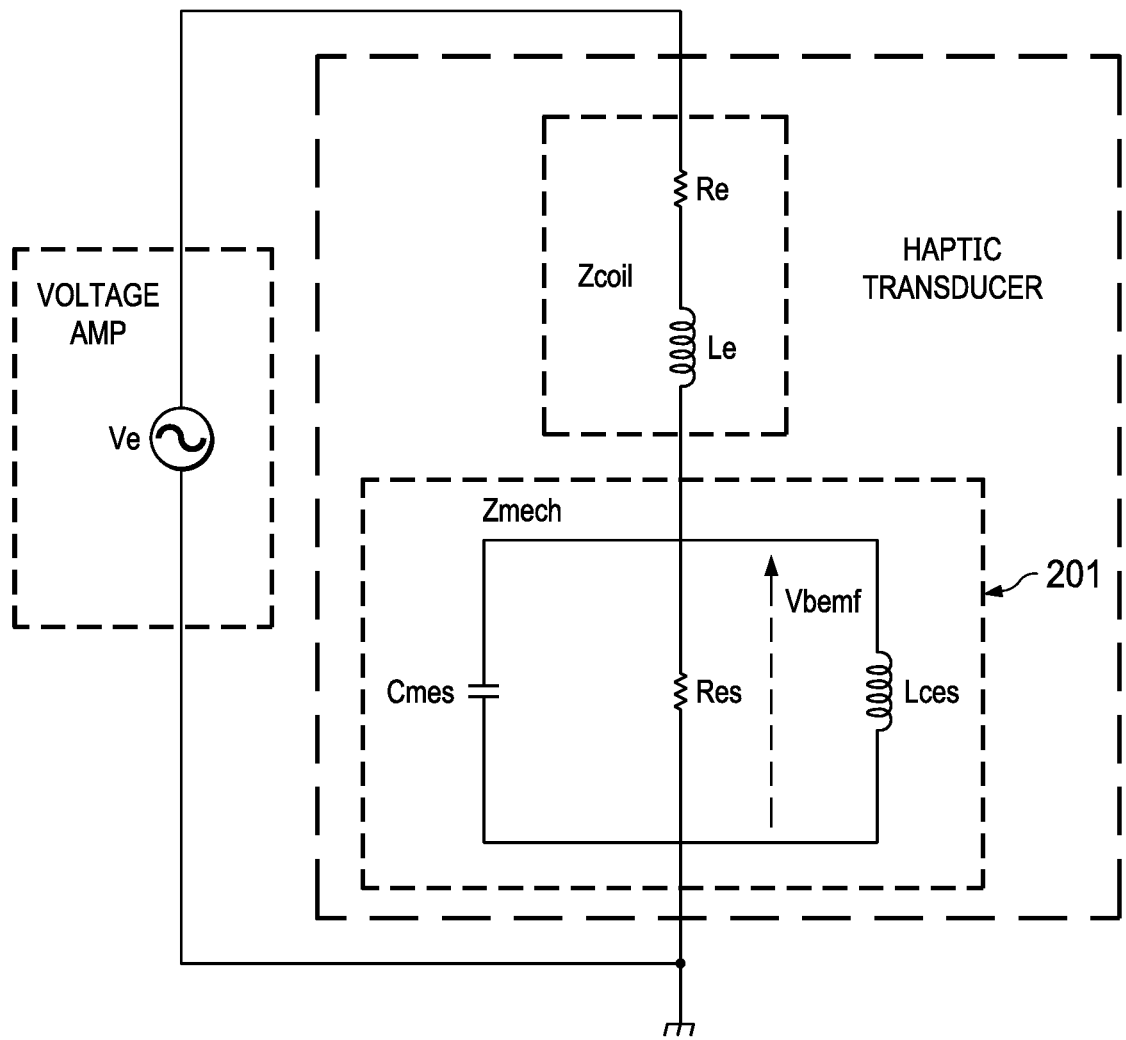
Figure 5:
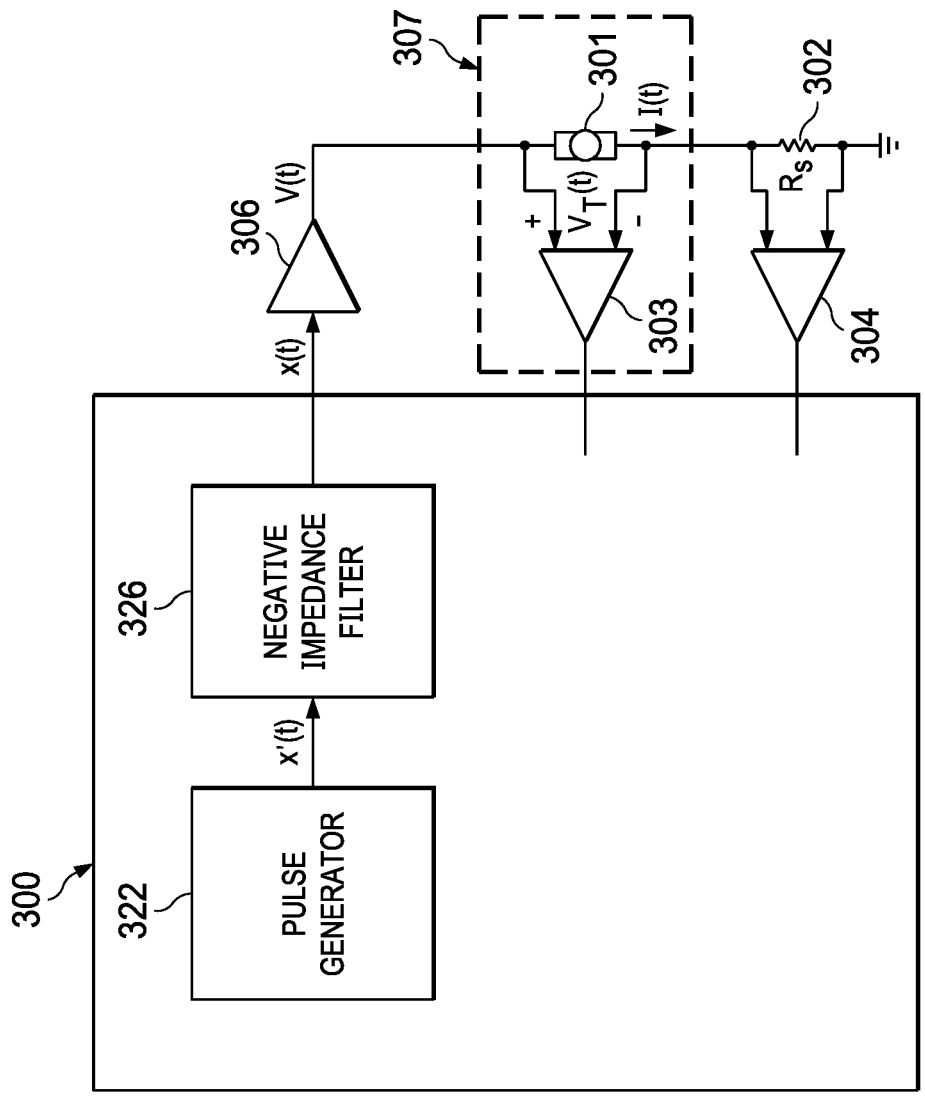
FIG. 5 illustrates an example system for improving transducer dynamics, in accordance with embodiments of the present disclosure.

FIG. 5 illustrates example system 300 for improving dynamics of an electromagnetic load, in accordance with embodiments of the present disclosure. In some embodiments, system 300 may be integral to a host device comprising system 300 and haptic transducer 301. Such device may include, without limitation, a mobile device, home application, a vehicle, and/or any other system, device, or apparatus that includes a human-machine interface. As described in greater detail below, a system 300 may implement negative impedance filter 326 to apply to the raw transducer driving signal, which may reduce an effective quality factor Q of the transducer, which may in turn decrease attack time and minimize ringing occurring after the raw transducer driving signal has ended. Quality factor Q of a transducer may be expressed as:

$$Q_{LRA} = \frac{R_{RES} * Re}{R_{RES} + Re} * \sqrt{\frac{c_{MES}}{L_{CES}}} \quad (7)$$

In equation (7), as DC resistance Re increases, the numerator term $R_{RES}*Re$ increases more rapidly than the denominator term $R_{RES}+Re$. Therefore, quality factor $Q_{LRA}$ generally increases with increasing DC resistance Re. Accordingly, one way system 300 may minimize quality factor q is to effectively decrease DC resistance Re. In some embodiments, system 300 may ideally decrease the effective DC resistance Re to a point in which critical damping occurs in transducer 301.

Figure 6:
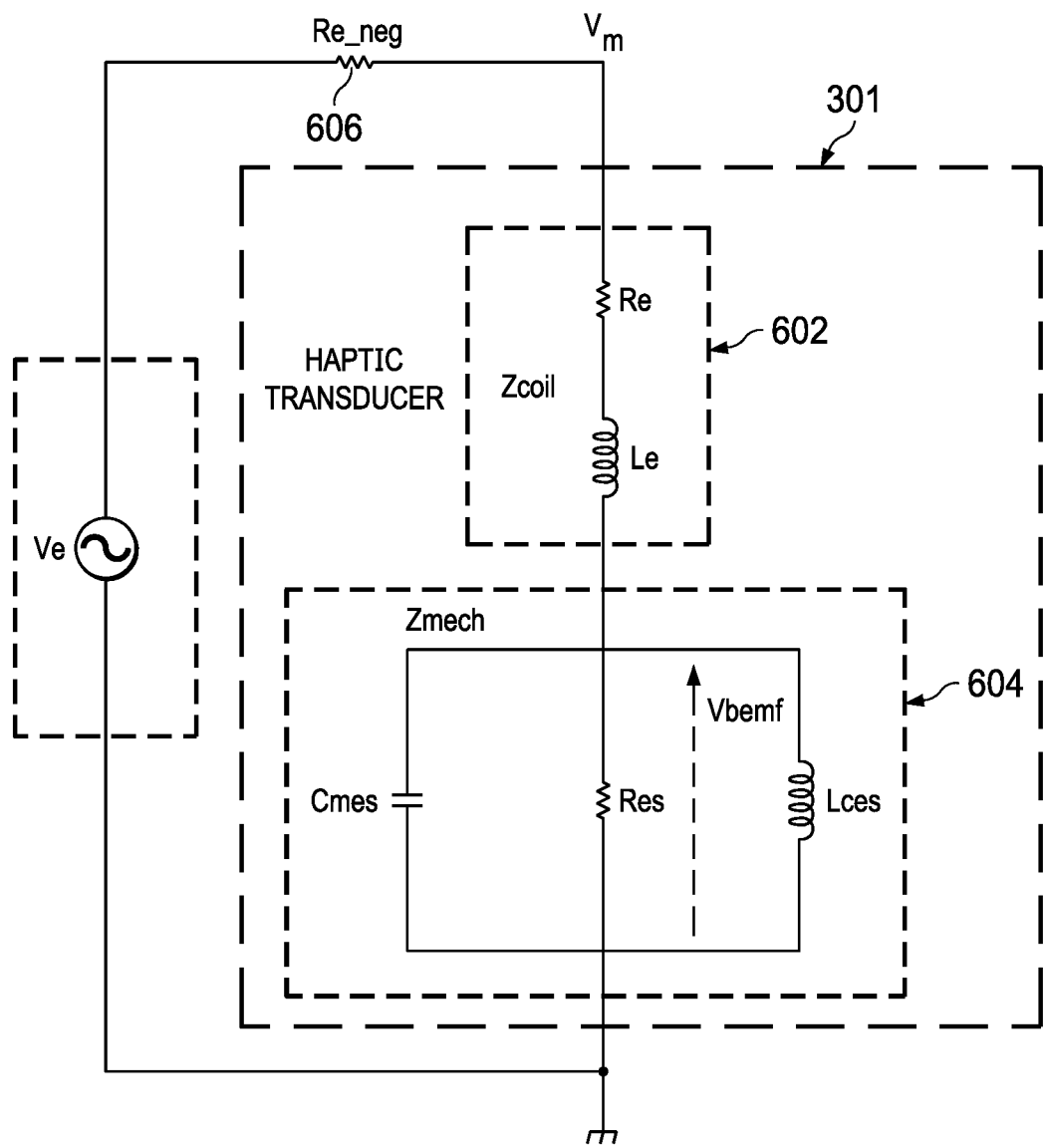
FIG. 6 illustrates an example of a Linear Resonant Actuator (LRA) modelled as a linear system and including a negative resistance, in accordance with embodiments of the present disclosure.

FIG. 6 illustrates an example of haptic transducer 301 modelled as a linear system including electrical components 602 and electrical model of mechanical components 604 and including a negative resistance resistor 606 with negative impedance Re_neg inserted in series with haptic transducer 301, in accordance with embodiments of the present disclosure. The addition of negative impedance Re_neg may lower quality factor $Q_{LRA}$ because effectively it subtracts from DC resistance Re thereby reducing the overall DC electrical impedance.

In practice, negative resistors do not exist. Instead, negative impedance filter 326 may comprise a digital filter configured to behave substantially like the circuit shown in FIG. 6, including a mathematical model of negative impedance Re_neg in series with a mathematical model of haptic transducer 301. In operation, negative impedance filter 326 may in effect compute a voltage $V_m$ that would occur at the junction of negative impedance Re_neg and DC resistance Re as shown in FIG. 6, if, in fact, it were possible to place a physical resistor with negative impedance Re_neg in series with haptic transducer 301. Computed voltage $V_m$ may then be used to drive haptic transducer 301.

From an examination of FIG. 6, a Laplace transform relationship between voltage $V_m$ and a driving voltage $V_e$ may be given by $$V_m(s) = V_e(s) * \frac{Z_{LRA}(s)}{(Z_{LRA}(s) - \text{Re\_neg})} \quad (8)$$

Equation (8) is effectively a voltage divider that outputs $V_m$ given input $V_e$. Negative impedance filter 326 may be a digital filter that implements a digital version of the transfer function:

$$Z_{NIF}(s) = \frac{Z_{LRA}(s)}{(Z_{LRA}(s) - \text{Re\_neg})} \quad (9)$$

Raw waveform signal x'(t) generated by pulse generator 322 and driven to negative impedance filter 326 in system 300 may correspond to a digital representation of driving voltage $V_e$ shown in FIG. 6. Waveform signal x(t) generated by negative impedance filter 326 may in turn correspond to voltage $V_m$. Voltage $V_m$ may be input to amplifier 306, which in turn may drive haptic transducer 301.

In some embodiments, negative impedance Re_neg may be represented as a fraction of DC resistance Re:

Re_neg=Re*Re_cancel (10)

Where factor Re_cancel may comprise a unitless value between 0 and 1, and may be chosen a-priori, representing the fraction of DC resistance Re that is to be cancelled by negative impedance filter 326.

Negative impedance filter 326 may implement a digital filter with transfer function corresponding to equation (9). Assuming that negative impedance Re_neg is given by equation (10), then implementation of negative impedance filter 326 as a digital filter may require a digital estimate of transducer impedance $Z_{LRA}$, DC resistance Re, and an a-priori choice for factor Re_cancel.

Negative impedance filter transfer function may be a third-order digital filter with z-transform represented as:

$$Z_{NIF}(z) = \frac{b0\_nif + b1\_nif * z^{-1} + b2\_nif * z^{-2} + b3\_nif * z^{-3}}{1 + a1\_nif * z^{-1} + a2\_nif * z^{-2} + a3\_nif * z^{-3}} \quad (11)$$

The coefficients b0_nif, b1_nif, b2_nif, b3_nif, a1_nif, a2_nif, and a3_nif of negative impedance filter 326 may embody the information about transducer impedance $Z_{LRA}$, DC resistance Re, and factor Re_cancel.

Example methods and systems for online real-time estimation of parameters of haptic transducer impedance $Z_{LRA}$ are described in U.S. Provisional Patent Application Ser. No.

62/826,388, filed Mar. 29, 2019, and in any application claiming priority thereto, all of which are incorporated by reference in their entireties, and may be referred to herein as the "Estimating Patent Application" and is incorporated by reference in its entirety.

In the "Estimating Patent Application," a method is described that separates the estimation problem into an estimation of coil impedance $Z_{coil}$=Re+Le*s on the one hand and estimation of mechanical impedance $Z_{mech}$ on the other. In particular, the electrical equivalent of mechanical impedance $Z_{mech}$ may be estimated using least-squares estimation as a second-order system which is then placed in series with coil impedance $Z_{coil}$ to determine a third-order haptic transducer impedance $Z_{LRA}$. In the "Estimating Patent Application," a second-order mechanical impedance $Z_{mech}$ may be estimated from three least-squares parameter estimates: g, a1, and a2. A full haptic transducer impedance $Z_{LRA}$ may then be estimated from these three parameters plus separately estimated DC coil resistance Re and coil inductance Le.

$$Z_{LRA} = \frac{V_{LRA}(s)}{I_{LRA}(s)}$$

is a transfer function that may describe a filter that takes current as input and produces a voltage as output. However, it may be desirable to find parameters b0_nif, b1_nif, b2_nif, b3_nif, a1_nif, a2_nif, and a3_nif for negative impedance filter 326 that describes a voltage divider that takes $V_e(z)=V_{LRA}(z)$ input and produces voltage $V_m(z)$ as output. By using equation (9) from above and knowledge of separately estimated DC coil resistance Re (e.g., it may be assumed that coil inductance Le is fixed and estimated a-priori by laboratory measurements or other means), expressions for negative impedance filter 326 may be provided. Substituting the expressions for haptic transducer impedance $Z_{LRA}$ involving g, a1, a2 and Re from the "Estimating Patent Application" into equation (9) above, and applying the Bilinear Transform to convert from continuous time to discrete (digital) time, expressions for parameters b0_nif, b1_nif, b2_nif, b3_nif, a1_nif, a2_nif, and a3_nif may be derived for negative impedance filter 326. An inductance Le_nrm and an impedance Zfb may be defined by:

Le_nrm=2*Le*fs;

Zfb=Re_cancel*Re;

Unnormalized coefficients for the negative impedance filter 326 may be defined as:

b0_nif=-Le_nrm-Re-g;

b1_nif=Le_nrm-Re-g-Le_nrm*a1-Re*a1;

b2_nif=g+Le_nrm*a1-Le_nrm*a2-Re*a1-Re*a2;

b3_nif=g+Le_nrm*a-Re*a2;

a0_nif=Zfb-Le_nrm-Re-g;

a1_nif=Zfb+Le_nrm-Re-g+Zfb*a1-Le_nrm*a1-Re*a1;

a2_nif=g+Zfb*a1+Zfb*a2+Le_nrm*a1-Le_nrm*a2-Re*a1-Re*a2;

and a3_nif=g+Zfb*a2+Le_nrm*a2-Re*a2.

All of these expressions may further be normalized by dividing the above coefficients by a0_nif to arrive at final parameter coefficients b0_nif, b1_nif, b2_nif, b3_nif, a1_nif, a2_nif, and a3_nif of negative impedance filter 326.

The transfer function of negative impedance filter 326 may be a third-order digital filter with a z-transform represented as:

$$Z_{NIF}(z) = \frac{b0\_nif + b1\_nif * z^{-1} + b2\_nif * z^{-2} + b3\_nif * z^{-3}}{1 + a1\_nif * z^{-1} + a2\_nif * z^{-2} + a3\_nif * z^{-3}} \quad (12)$$

wherein coefficients b0_nif, b1_nif, b2_nif, b3_nif, a1_nif, a2_nif, and a3_nif of negative impedance filter 326 embody information about transducer impedance $Z_{LRA}$, DC resistance Re, and factor Re_cancel.

In some embodiments, knowledge of the electrical and electrical equivalent transducer parameters Re, Le, $R_{RES}$, $C_{MES}$, $L_{CES}$ may be obtained offline. This knowledge may result from laboratory measures of a transducer device and/or from data published by a transducer manufacturer.

The expression for the transfer function of negative impedance filter 326 function given in equation (9) is in the form of an s-domain Laplace transform. Such expression may be converted to a digital z-transform using any number of standard techniques such as the Bilinear Transform, the Impulse Invariant Transform, and others.

By substituting equation (2) for transducer impedance $Z_{LRA}$ and equation (10) for negative resistance Re_neg in equation (9), the transfer function of negative impedance filter 326 may be expressed as $$Z_{NIF}(s) = \frac{Z_{coil}(s) + Z_{mech}(s)}{(Z_{coil}(s) + Z_{mech}(s)) - Re * \text{Re\_cancel}} \quad (13)$$

Further substituting equation (3) for $Z_{coil}(s)$ and equation (4) for $Z_{mech}(s)$ gives:

$$Z_{NIF}(s) = \frac{Re + s*Le + \left(\frac{1}{\left(\frac{1}{R_{REE}} + \frac{1}{L_{CES}*s} + c_{MES}*s\right)}\right)}{\left(\left(\frac{1}{\left(\frac{1}{R_{REE}} + \frac{1}{L_{CES}*s} + c_{MES}*s\right)}\right) - Re*\text{Re\_cancel}\right)} \quad (14)$$

Equation (13) may thus provide an expression for the Laplace transform of the transfer function $Z_{NIF}(s)$ of negative impedance filter 326 in terms of the electrical and electrical equivalent parameters Re, Le, $R_{RES}$, $C_{MES}$, $C_{MES}$, $L_{CES}$ as well as factor Re_cancel. To transform equation (14) to a digital filter z-transform using the Bilinear Transform, the Laplace variable s may be substituted according to:

$$s = 2*fs*\frac{(z-1)}{(z+1)} \quad (15)$$

If equation (15) is substituted into equation (14) and then simplified, an equation for the digital z-transform $Z_{NIF}(z)$ is obtained in the form of equation (12), where the coefficients b0_nif, b1_nif, b2_nif, b3_nif, a1_nif, a2_nif, and a3_nif are expressed in terms of Re, Le, $R_{RES}$, $C_{MES}$, $L_{CES}$ as well as factor Re_cancel, according to:

$$b0\_nif = (Re*Rres + 2*Lces*Re*fs + 2*Lces*Rres*fs + 2*Le*Rres*fs + 4*Lces*Le*fs^2 + 8*Cmes*Lces*Le*Rres*fs^3 + 4*Cmes*Lces*Re*Rres*fs^2)/(Re*Rres - Re*Re\_cancel*Rres + 2*Lces*Re*fs + 2*Lces*Rres*fs + 2*Le*Rres*fs + 4*Lces*Le*fs^2 - 2*Lces*Re*Re\_cancel*fs + 8*Cmes*Lces*Le*Rres*fs^3 + 4*Cmes*Lces*Re*Rres*fs^2 - 4*Cmes*Lces*Re*Re\_cancel*Rres*fs^2);$$

$$b1\_nif = (3*Re*Rres + 2*Lces*Re*fs + 2*Lces*Rres*fs + 2*Le*Rres*fs - 4*Lces*Le*fs^2 - 24*Cmes*Lces*Le*Rres*fs^3 - 4*Cmes*Lces*Re*Rres*fs^2)/(Re*Rres - Re*Re\_cancel*Rres + 2*Lces*Re*fs + 2*Lces*Rres*fs + 2*Le*Rres*fs + 4*Lces*Le*fs^2 - 2*Lces*Re*Re\_cancel*fs + 8*Cmes*Lces*Le*Rres*fs^3 + 4*Cmes*Lces*Re*Rres*fs^2 - 4*Cmes*Lces*Re*Re\_cancel*Rres*fs^2);$$

$$b2\_nif = -(2*Lces*Re*fs - 3*Re*Rres + 2*Lces*Rres*fs + 2*Le*Rres*fs + 4*Lces*Le*fs^2 - 24*Cmes*Lces*Le*Rres*fs^3 - 4*Cmes*Lces*Re*Rres*fs^2)/(Re*Rres - Re*Re\_cancel*Rres + 2*Lces*Re*fs + 2*Lces*Rres*fs + 2*Le*Rres*fs + 4*Lces*Le*fs^2 - 2*Lces*Re*Re\_cancel*fs + 8*Cmes*Lces*Le*Rres*fs^3 + 4*Cmes*Lces*Re*Rres*fs^2 - 4*Cmes*Lces*Re*Re\_cancel*Rres*fs^2);$$

$$b3\_nif = -(2*Lces*Re*fs - Re*Rres + 2*Lces*Rres*fs + 2*Le*Rres*fs - 4*Lces*Le*fs^2 + 8*Cmes*Lces*Le*Rres*fs^3 - 4*Cmes*Lces*Re*Rres*fs^2)/(Re*Rres - Re*Re\_cancel*Rres + 2*Lces*Re*fs + 2*Lces*Rres*fs + 2*Le*Rres*fs + 4*Lces*Le*fs^2 - 2*Lces*Re*Re\_cancel*fs + 8*Cmes*Lces*Le*Rres*fs^3 + 4*Cmes*Lces*Re*Rres*fs^2 - 4*Cmes*Lces*Re*Re\_cancel*Rres*fs^2);$$

$$a1\_nif = (3*Re*Rres - 3*Re*Re\_cancel*Rres + 2*Lces*Re*fs + 2*Lces*Rres*fs + 2*Le*Rres*fs - 4*Lces*Le*fs^2 - 2*Lces*Re*Re\_cancel*fs + 24*Cmes*Lces*Le*Rres*fs^3 - 4*Cmes*Lces*Re*Rres*fs^2 - 4*Cmes*Lees*Re*Re\_cancel*Rres*fs^2)/(Re*Rres - Re*Re\_cancel*Rres + 2*Lces*Re*fs + 2*Lces*Rres*fs + 2*Le*Rres*fs + 4*Lces*Le*fs^2 - 2*Lces*Re*Re\_cancel*fs + 8*Cmes*Lees*Le*Rres*fs^3 + 4*Cmes*Lces*Re*Rres*fs^2 - 4*Cmes*Lces*Re*Re\_cancel*Rres*fs^2);$$

$$a2\_nif = -(3*Re*Re\_cancel*Rres - 3*Re*Rres + 2*Lces*Re*fs + 2*Lces*Rres*fs + 2*Le*Rres*fs - 4*Lces*Le*fs^2 - 2*Lces*Re*Re\_cancel*fs - 24*Cmes*Lces*Le*Rres*fs^3 + 4*Cmes*Lees*Re*Rres*fs^2 - 4*Cmes*Lces*Re*Re\_cancel*Rres*fs^2)/(Re*Rres\ Re*Re\_cancel*Rres + 2*Lces*Re*fs + 2*Lces*Rres*fs + 2*Le*Rres*fs + 4*Lces*Le*fs^2 - 2*Lces*Re*Re\_cancel*fs + 8*Cmes*Lces*Le*Rres*fs^3 + 4*Cmes*Lces*Re*Rres*fs^2 - 4*Cmes*Lces*Re*Re\_cancel*Rres*fs^2)$$

$$a3\_nif = -(Re*Re\_cancel*Rres - Re*Rres + 2*Lces*Re*fs + 2*Lces*Rres*fs + 2*Le*Rres*fs - 4*Lces*Le*fs^2 - 2*Lces*Re*Re\_cancel*fs + 8**Cmes*Lces*Le*Rres*fs^3 - 4*Cmes*Lces*Re*Rres*fs^2 + 4*Cmes*Lces*Re*Re\_cancel*Rres*fs^2)/(Re*Rres - Re*Re\_cancel*Rres + 2*Lces*Re*fs + 2*Lces*Rres*fs + 2*Le*Rres*fs + 4*Lces*Le*fs^2 - 2*Lces*Re*Re\_cancel*fs + 8*Cmes*Lces*Le*Rres*fs^3 + 4*Cmes*Lees*Re*Rres*fs^2 - 4*Cmes*Lces*Re*Re\_cancel*Rres*fs^2)$$

In embodiments in which parameters Re, Le, $R_{RES}$, $C_{MES}$, $L_{CES}$ as well as factor Re_cancel are obtained offline, the expressions above may be used to compute the coefficients for the negative impedance filter 326.

Although the foregoing discusses application to a linear electromagnetic load, it is understood that systems and methods similar or identical to those disclosed may be applied to other linear or non-linear systems.

Further, although the foregoing contemplates use of a negative resistance filter to implement a model of an LRA, in some embodiments a mathematical equivalent to an LRA may be used in lieu of a model.

Accordingly, using the systems and methods described above, a system (e.g., system 300) may include a signal generator (e.g., pulse generator 322) configured to generate a raw waveform signal (e.g., raw waveform signal x'(t)) and a modeling subsystem (e.g., negative impedance filter 326) configured to implement a discrete time model (e.g., model shown in FIG. 6) of an electromagnetic load (e.g., haptic transducer 301) that emulates a virtual electromagnetic load and further configured to modify the raw waveform signal to generate a waveform signal (e.g., waveform signal x(t)) for driving the electromagnetic load by modifying the virtual electromagnetic load to have a desired characteristic (e.g., applying negative resistance 606), applying the discrete time model to the raw waveform signal to generate the waveform signal for driving the electromagnetic load, and applying the waveform signal to the electromagnetic load.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a signal generator configured to generate a raw waveform signal; and
a modeling subsystem configured to implement a discrete time model of a physical electromagnetic load wherein the discrete time model emulates a virtual electromagnetic load and the modeling subsystem further configured to modify the raw waveform signal to generate a waveform signal for driving the physical electromagnetic load by:
modifying the virtual electromagnetic load to have a desired characteristic;
applying the discrete time model to the raw waveform signal to generate the waveform signal for driving the physical electromagnetic load; and
applying the waveform signal to the physical electromagnetic load.

2. The system of claim 1, wherein the physical electromagnetic load is a haptic transducer.

3. The system of claim 1, wherein the discrete time model is based on one or more parameters of the physical electromagnetic load determined based on laboratory simulation.

4. The system of claim 1, wherein the discrete time model is based on one or more parameters of the physical electromagnetic load determined based on real-time estimation of the one or more parameters during operation of the system.

5. The system of claim 4, wherein the real-time estimation is performed based on broadband content of at least a beginning of a transient of the waveform signal and an end of a transient of the waveform signal.

6. The system of claim 4, wherein the modeling subsystem is configured to periodically update the real-time estimation in order to achieve the desired characteristic.

7. The system of claim 1, wherein the desired characteristic is a desired impedance of a virtual transducer.

8. A method comprising:
implementing a discrete time model of a physical electromagnetic load that emulates a virtual electromagnetic load; and
modifying a raw waveform signal to generate a waveform signal for driving the physical electromagnetic load by:
modifying the virtual electromagnetic load to have a desired characteristic;
applying the discrete time model to the raw waveform signal to generate the waveform signal for driving the physical electromagnetic load; and
applying the waveform signal to the physical electromagnetic load.

9. The method of claim 8, wherein the physical electromagnetic load is a haptic transducer.

10. The method of claim 8, wherein the discrete time model is based on one or more parameters of the physical electromagnetic load determined based on laboratory simulation.

11. The method of claim 8, wherein the discrete time model is based on one or more parameters of the physical electromagnetic load determined based on real-time estimation of the one or more parameters during operation of the system.

12. The method of claim 11, wherein the real-time estimation is performed based on broadband content of at least a beginning of a transient of the waveform signal and an end of a transient of the waveform signal.

13. The method of claim 11, further comprising periodically updating the real-time estimation in order to achieve the desired characteristic.

14. The method of claim 8, wherein the desired characteristic is a desired impedance of a virtual transducer.

15. A host device comprising:
a physical electromagnetic load;
a signal generator configured to generate a raw waveform signal; and
a modeling subsystem configured to implement a discrete time model of the physical electromagnetic load wherein the discrete time model emulates a virtual electromagnetic load and the modeling subsystem further configured to modify the raw waveform signal to generate a waveform signal for driving the physical electromagnetic load by:
modifying the virtual electromagnetic load to have a desired characteristic;
applying the discrete time model to the raw waveform signal to generate the waveform signal for driving the physical electromagnetic load; and
applying the waveform signal to the physical electromagnetic load.

16. The host device of claim 15, wherein the physical electromagnetic load is a haptic transducer.

17. The host device of claim 15, wherein the discrete time model is based on one or more parameters of the physical electromagnetic load determined based on laboratory simulation.

18. The host device of claim 15, wherein the discrete time model is based on one or more parameters of the physical electromagnetic load determined based on real-time estimation of the one or more parameters during operation of the system.

19. The host device of claim 18, wherein the real-time estimation is performed based on broadband content of at least a beginning of a transient of the waveform signal and an end of a transient of the waveform signal.

20. The host device of claim 18, wherein the modeling subsystem is configured to periodically update the real-time estimation in order to achieve the desired characteristic.

21. The host device of claim 15, wherein the desired characteristic is a desired impedance of a virtual transducer.

* * * * *